United States Patent [19]

Asada

[11] Patent Number: 5,652,151
[45] Date of Patent: Jul. 29, 1997

[54] METHOD FOR DETERMINING AN IMPURITY CONCENTRATION PROFILE

[75] Inventor: Susumu Asada, Tokyo, Japan

[73] Assignee: NEC Corporation, Tokyo, Japan

[21] Appl. No.: 636,696

[22] Filed: Apr. 23, 1996

[30] Foreign Application Priority Data

Apr. 27, 1995 [JP] Japan .................................. 7-104158

[51] Int. Cl.⁶ .................................................. H01L 21/66
[52] U.S. Cl. .................................................. 437/8; 437/24
[58] Field of Search .......................... 437/7, 8, 20, 24, 437/947, 981; 148/DIG. 161, DIG. 162

[56] References Cited

U.S. PATENT DOCUMENTS

| | | | |
|---|---|---|---|
| 4,100,310 | 7/1978 | Ura et al. | 437/8 |
| 4,360,964 | 11/1982 | Gilly et al. | 437/8 |
| 5,451,529 | 9/1995 | Hsu et al. | 437/8 |
| 5,520,769 | 5/1996 | Barrett et al. | 437/8 |

OTHER PUBLICATIONS

"Study on Three–Dimensional Distribution of Implanted Ions by He+ Backscattering Technique," Hiroshi Ishiwara et al., Proceedings of the 4th Conference on Solid State Devices, Tokyo, 1972, Supplement to the Journal of the Japan Society of Applied Physics, vol. 42, 1973, pp. 124–129.

"Resistivity of Bulk Silicon and of Diffused Layers in Silicon," John C. Irvin, The Bell System Technical Journal, vol. XLI, No. 2, Mar. 1962, pp. 387–411.

*Primary Examiner*—Chandra Chaudhari
*Attorney, Agent, or Firm*—Foley & Lardner

[57] ABSTRACT

Impurity concentration profile is determined for a diffused layer of a semiconductor substrate by repeating a combination of etching of the diffused layer and measuring sheet resistance and/or hall resistance by using electrodes formed on the diffused layer. The etching of the diffused layer by a small amount is repeated in first portions aligned in the depth direction of the diffused layer, followed by etching of adjacent second portions aligned in the depth direction. The etching may be replaced by implanting inactive ions into portions of the diffused layer to generate high resistance for the portions.

15 Claims, 6 Drawing Sheets

METHOD FOR DETERMINING AN IMPURITY CONCENTRATION PROFILE

BACKGROUND OF THE INVENTION (a) Field of the Invention

The present invention relates to a method for determining an impurity concentration profile in a semiconductor integrated circuit.

(b) Description of the Related Art

Impurities are generally contained in a semiconductor in a very small amount as a dopant or contaminants, and have a great influence upon the functions of a semiconductor device. To illustrate this, the following description will be made with reference to a silicon device which is a typical device of a CMOS or DRAM.

In a silicon device, impurity ions are implanted into a silicon substrate as a dopant by an ion implantation process, then subjected to a thermal treatment for diffusion and activation of the dopant. It is known that a resultant impurity distribution causes a great change in electric parameters such as threshold voltage Vt or the like.

It is recognized in the art that when a cell size and accordingly gate length are reduced in an attempt to meet the demands for a higher density, a higher capacity and a higher speed of operation of silicon devices, there occurs a problem of the short channel effect which reduces the threshold voltage Vt of an FET. On the other hand, in order to simplify the process used, ions are implanted at various energy levels including a high energy range, and many processes are used in which a diffusion takes place at relatively low temperatures and within short intervals. As a consequence of these practices, it has become clear that an impurity distribution exhibits a very complicated behavior depending on residual damage caused by the ion implantation. The effect of such impurity distribution manifests itself as the reverse short channel effect in which the threshold voltage Vt increases in an extraordinary manner toward the short lengths of the gate, which becomes a critical factor in variation of the threshold voltage Vt, thereby presenting serious problems in the design of fine silicon devices.

To cope with such problems, it is known in the art that SIMS (Secondary Ion Spectrometry) process is effective as a method of determining the impurity distribution in the semiconductor. In the SIMS process, primary ions such as cesium or oxygen ions are irradiated to generate secondary ions, which are then subject to a mass spectroscopy. However, such process is only effective for a specimen in which the impurity is uniformly distributed over a sufficiently extensive region of the semiconductor.

SRP (Spread Resistance Profile) technique is also known in the prior art In which a specimen is polished along a skewed plane to determine a sheet resistance from the relationship between a voltage and a current across a pair of terminals. By this method, a known relationship between the sheet resistance and the impurity concentration, which is established experimentally, is utilized to derive a distribution of impurity concentrations within the semiconductor.

A chemical etching technique is also well known as a method of determining a two dimensional distribution of a junction. The method, however, can be used only when the impurity concentration is at a high level, and the accuracy thereof is not satisfactory.

In a semiconductor device, a trace amount of an impurity such as a dopant is distributed in a minute region in the depth direction as well as in lateral directions. It has been difficult to determine the distribution profile for a trace amount of impurities in a minute region of a micron order by using the prior art method mentioned above, due to the limitation of counting secondary ions in the SIMS process or the limitation of terminal size in the SRP process. While the chemical etching technique is simple and convenient in determining a two dimensional distribution, it requires the presence of sufficiently high impurity concentration, as mentioned above. In addition, the difficulty in controlling the chemical reaction results in an insufficient resolution in determining the depthwise or lateral spread.

A method of determining a lateral spread of impurities which are introduced by an ion implantation technique is disclosed in Proceeding of the 4th Conf. on Solid State Devices, Supplement to the Journal of the Japan Soc. of Appl. Phys., Vol. 42, 1973. This method is directed to determination of the profile in the depth direction while changing the angle of incidence of the ion implantation, and deriving the width of the lateral spread from the results thus obtained. In other words, this method is available only when the depthwise and lateral spread is previously known as functions of the incident angle of implantation.

A prior art knowledge in which a lateral spread and depthwise spread are determined as functions of the incident angle of implantation is available only for very restricted cases of ion implantation to which an analytical LSS theory is applicable, and accordingly this method cannot be applied in determining the profile in a semiconductor device subsequent to a process such as a thermal diffusion process.

Thus, it has been substantially impossible to determine an impurity profile in a semiconductor region which has sides on the order of sub-micron by using the prior art method mentioned above, although it is requested in fine semiconductor devices.

SUMMARY OF THE INVENTION

It is therefore an object of the present invention to provide a method which enables the determination of a profile of an impurity in a very small region of a semiconductor, which has been difficult to deal with by a prior art method.

According to the present invention, there is provided a method for determining an impurity concentration profile in a diffused region of a semiconductor. The method includes the steps of forming a plurality of electrodes on the surface of the diffused region, etching the surface of the diffused region at least one of lateral direction and depth direction, measuring at least one of sheet resistance and hall resistance of the etched surface of the diffused region by using the electrodes, and converting the measured values of the one of sheet resistance and hall resistance into corresponding impurity concentrations.

The present invention allows the determination of a profile of an impurity concentration in a very small region of a semiconductor with a high accuracy, affording an excellent tool in the design of semiconductor devices.

The etching step in the method as described above may be replaced by a step of implanting inactive ions such as Ga ions into the diffused region to thereby providing a high resistance for the implanted portion of the diffused region.

DETAILED DESCRIPTION OF PREFERRED EMBODIMENTS

Referring to the accompanying drawings, preferred embodiments of the present invention will now be described in more detail.

EMBODIMENT 1

Figure 1:
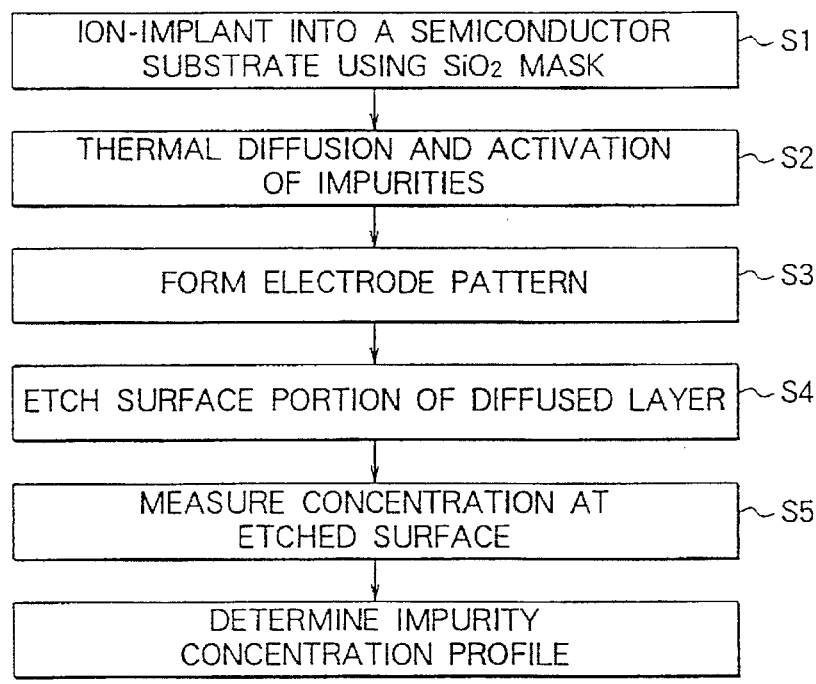
FIG. 1 is a flowchart of a method for determining impurity concentration profile according to a first embodiment of the present invention.

In the present embodiment and the following embodiment, determination of a distribution of boron will be described, the boron representing a P-type impurity most commonly used in a silicon semiconductor device. FIG. 1 is a flow chart illustrating a general process flow according to the present embodiment. The process includes the procedure of forming a diffused region as well as the procedure for determining the impurity concentration profile therefor. The diffused region is formed by an ion-implantation technique using a specific ions and specific conditions planned for a designed semiconductor device to thereby provide a specimen to be measured for the designed semiconductor device.

Figure 3:
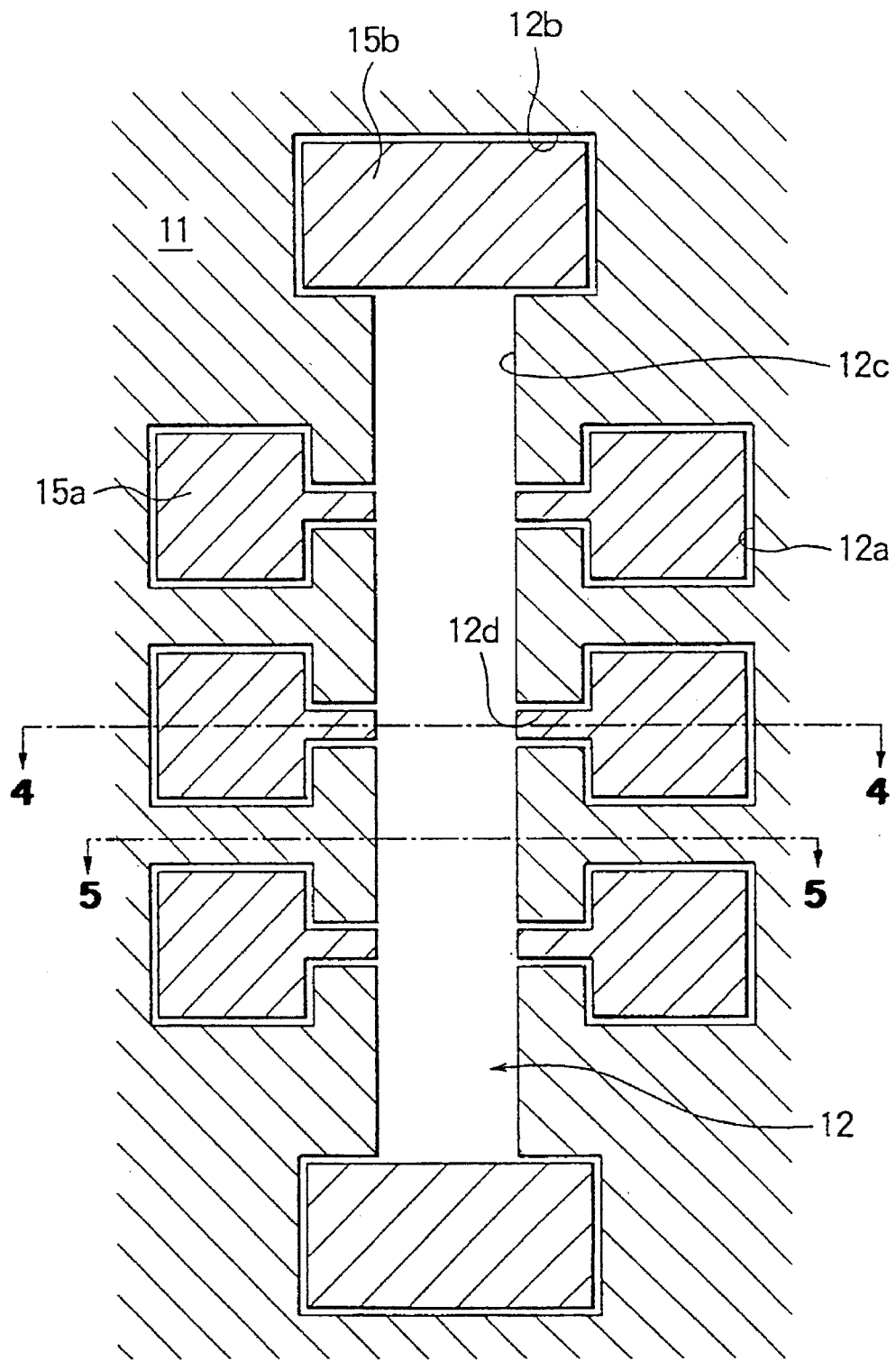
FIG. 3 is a plan view of a semiconductor sample used in carrying out the method of FIG. 1.

Initially, an N-type silicon substrate is provided, on which an $SiO_2$ film is grown at first step S1 having a thickness greater than the energy range of the boron ions to be implanted. By lithography, a mask pattern is then formed from the $SiO_2$ film. As shown in FIG. 3, the mask pattern 11 for use in the ion implantation has an opening 12 including a plurality of (six) square first portions 12a, two rectangular second portions 12b disposed opposite to each other in a vertical direction as viewed in the drawing, a single, rectangular third portion 12c coupling the second portions 12b together, and a plurality of (six) stripe portions 12d coupling the first portions 12a with the third portions 12c. In the present embodiment, the boron ions are implanted through the opening 12 by using the mask pattern 11 as a mask, and the diffused layer portion exposed from the third portion 12c of the opening 12 and adjacent diffused layer portions are subject to determination of the impurity concentration profile.

Figure 4A:
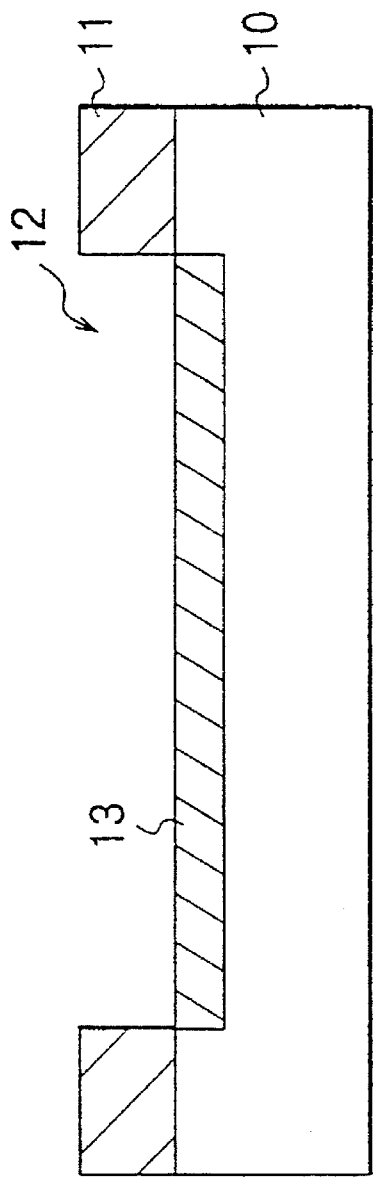
FIGS. 4A, 4B and 4C are cross-sectional views taken along the line 4—4 in FIG. 3, showing consecutive steps in the first embodiment.

FIG. 4A shows a cross section taken along the line 4—4 in FIG. 3 subsequent to the first step S1 in the first embodiment. Impurity ions are implanted through the opening 12, defined by the mask pattern 11, into the semiconductor substrate 10 to form an implanted layer 13, as shown in FIG. 4A.

Figure 4B:
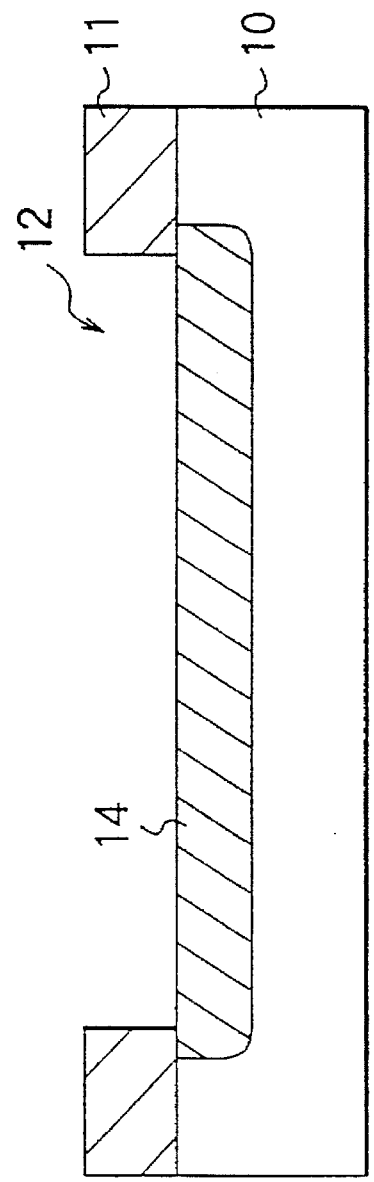

At second step S2, a thermal treatment step is employed as employed in manufacturing of a typical semiconductor device to provide a diffusion and an activation of the implanted impurity ions in the substrate 10. FIG. 4B shows a cross section taken along the line 4—4 in FIG. 3 subsequent to the completion of the second step S2 in the first embodiment. The thermal treatment produces a diffused layer (region) 14 within the substrate 10 in which the impurity is distributed by the thermal process.

Figure 2:
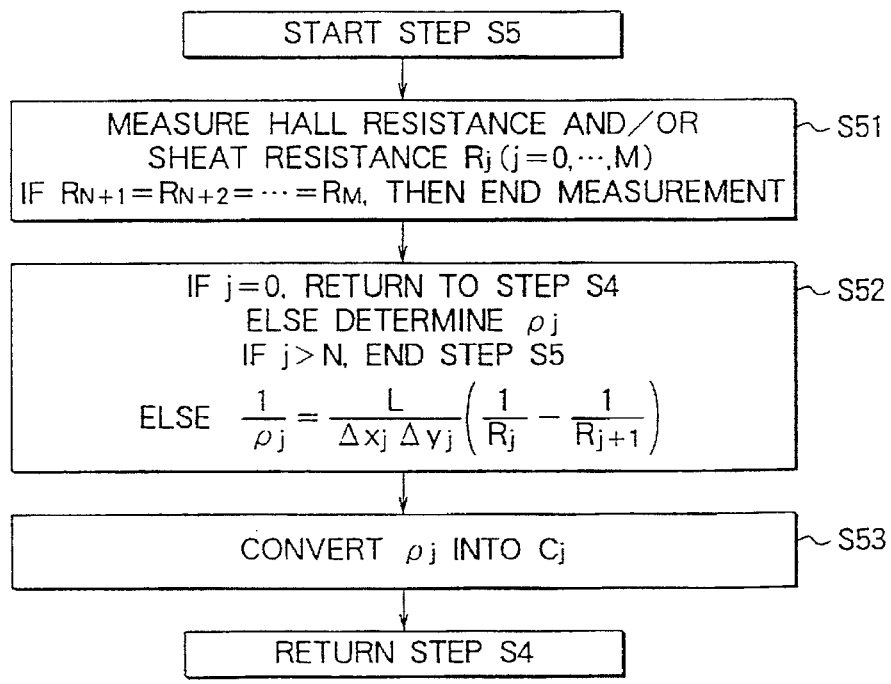
FIG. 2 is a flow chart showing a detail of a step used in the first embodiment.
Figure 4C:
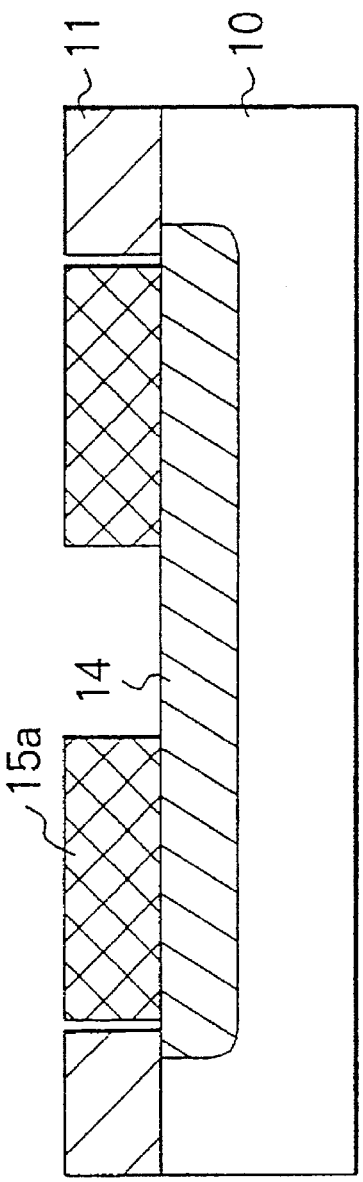

At third step S3, as shown in FIG. 3, an electrode pattern 15 for Hall resistance measurement is formed including six terminals 15a in the respective first portions 12a and two electrodes 15b formed in the respective second portions 12b. The electrode pattern 15 is made of a metal such as alminum. It is to be noted that the six electrodes 15a in the present embodiment also serve as the terminal for the measurement of the sheet resistance of the diffused layer 14. FIG. 4C is a cross section taken along the line 4—4 in FIG. 3 subsequent to the formation of the electrode pattern 15 at the third step S3 of the present embodiment showing electrode 15a on the diffused layer 14. Then a combination of a step of back sputtering to lower the surface level of the diffused layer or selective side etching of the $SiO_2$ film to enlarge the openings (fourth step S4) and a step of a sheet resistance measurement and/or hall measurement (fifth step S5) are iterated. In FIG. 2, operation at step fifth S5 is shown. The step S5 includes measurement of sheet resistance and/or hall resistance at step S51, calculating resistivity $\rho_j$ at step S52, and converting the resistivity $\rho_j$ into impurity concentration $C_j$ at step S53. The repeated etchings of the diffused layer 14 advancing in the lateral and vertical directions are shown in FIGS. 5A, 5B and 5C, which are taken along the line 5—5 in FIG. 3 for consecutively showing the etched stages of the diffused layer 14.

Figure 5A:
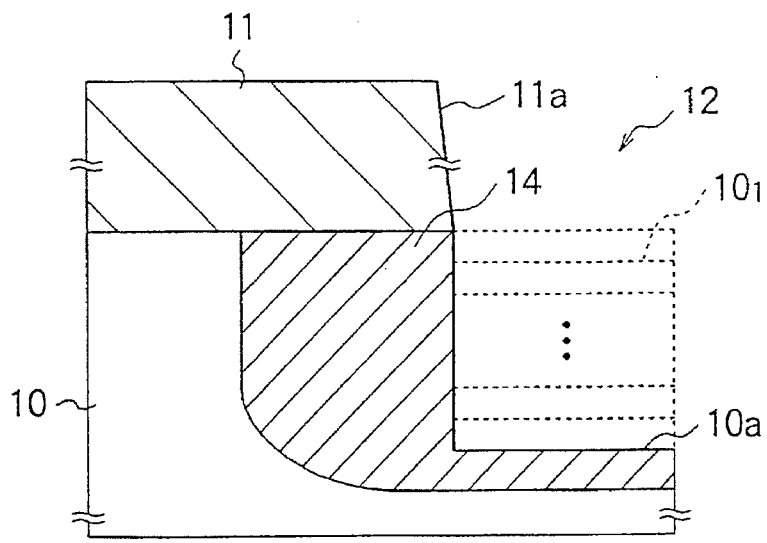
FIGS. 5A, 5B and 5C are cross-sectional views taken along the line 5—5 in FIG. 3, showing consecutive etched stages in the diffused region in the process of FIG. 1.
Figure 5B:
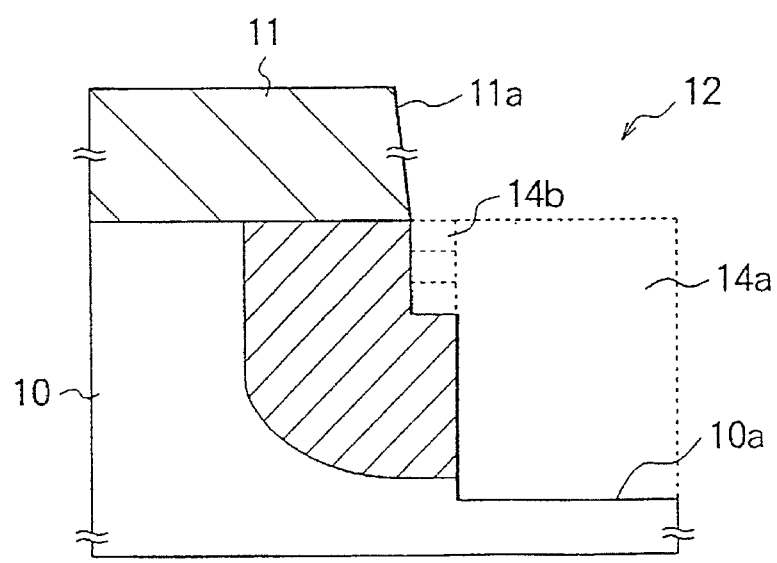
Figure 5C:
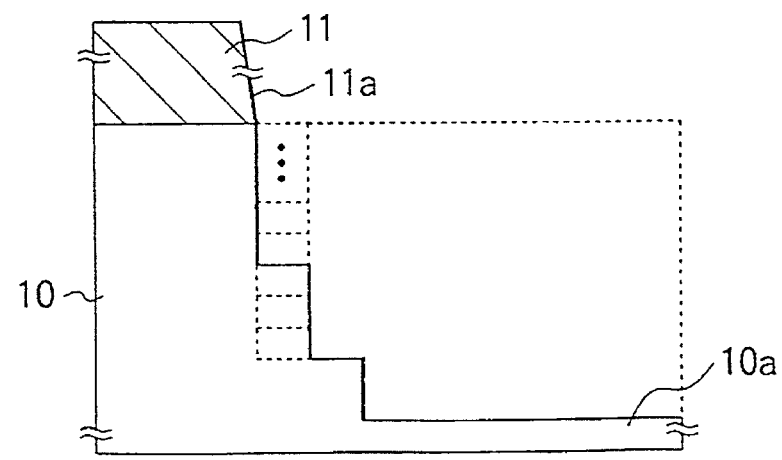

Specifically in FIG. 5A, at an initial stage of the etching step, a back sputtering is executed to the silicon surface by using the $SiO_2$ film 11 as a mask to form a lower level $10_1$ of the diffused layer 14, which is lower than the original silicon surface by a depth of 40 nanometer (am), for example. Subsequently, a sheet resistance measurement and/ or hall measurement using the electrode pattern 15 is conducted at fifth step S5 for the etched surface $10_1$, following which a subsequent back sputtering is executed to further etch the diffused layer 14 by 40 nm at fourth step S4. The back sputtering of the diffused layer 14 and the measurement of the sheet resistance etc. are periodically conducted toward the lower level of the diffused layer 14.

In FIG. 5A, after the etched silicon surface 10a reaches the bottom of the diffused layer 14, next measurements are conducted after enlarging the opening 12 by a selective etching of the side wall 11a of the $SiO_2$ film 11 by an ion-milling technique. Subsequently, etching of the exposed annular portion 14b of the diffused layer 14 adjacent to the etched portion 14a of the diffused layer 14 is then executed to expose a lower level of the diffused layer 14 which is lower than the initial silicon surface by 40 nm, following which a sheet resistance/hall resistance measurement for the annular exposed surface portion are executed. The etching of the annular exposed surface portion and sheet resistance and/or hall resistance measurement for the annular surface portion are conducted periodically to reach the bottom of the diffused layer 14 of the silicon substrate 10, as shown in FIG. 5B. The selective ion-milling of the $SiO_2$ film and subsequent combination of the etchings of the diffused layer 14 and measurements for the annular surface portion thus etched are also periodically conducted. After the measurements of the annular, etched surface portions exhibit a constant low value for different levels as a result of the etching step S4 exceeding laterally away from the diffused layer 14, the procedure for the ion-milling, etching and measurement is finished.

The measuring step at S5 includes a conversion step S53 for converting the measured sheet resistance and/or Hall resistance into an impurity concentration, as shown in FIG. 2. Specifically, in FIG. 5, sheet resistance or Hall resistance Rj (j=1 .... M) is measured for a (j−1)-th central or annular portion of the diffused layer 14, in which j=1 corresponds to an initial central silicon surface. The measurement is completed after a suitable value of M is reached where $R_{N+1}=R_{N+2}=\ldots=R_M$ holds for the values measured at sufficient number of levels aligned in the depth direction.

The resistivity $\rho_j$ of a (j−1)-th small portion having a width $\Delta x_j$, a depth $\Delta y_j$ and a length L is calculated according to the equation given below:

$$1/\rho_j = L \cdot (1/R_j - 1/R_{j+1})/(\Delta x_j \cdot \Delta y_j) (j=1, \ldots, M)$$

By utilizing a known relationship between the impurity concentration and resistivity $\rho_j$ of a diffused layer having a given uniform concentration, the impurity concentration $C_j$ for the j-th portion is calculated. It is to be noted that a relationship between the impurity concentration $C_j$ and the resistivity $\rho_j$ for a typical diffused layer having a given uniform concentration is described, for example, in Bell Syst. Tech. J., Vol. 41, (1962), pp. 387.

A combination of the fourth, etching step S4 and the fifth, measuring step S5 is repeated until the impurity concentration is determined for all levels or portions to obtain the impurity concentration for the entire region.

Figure 6:
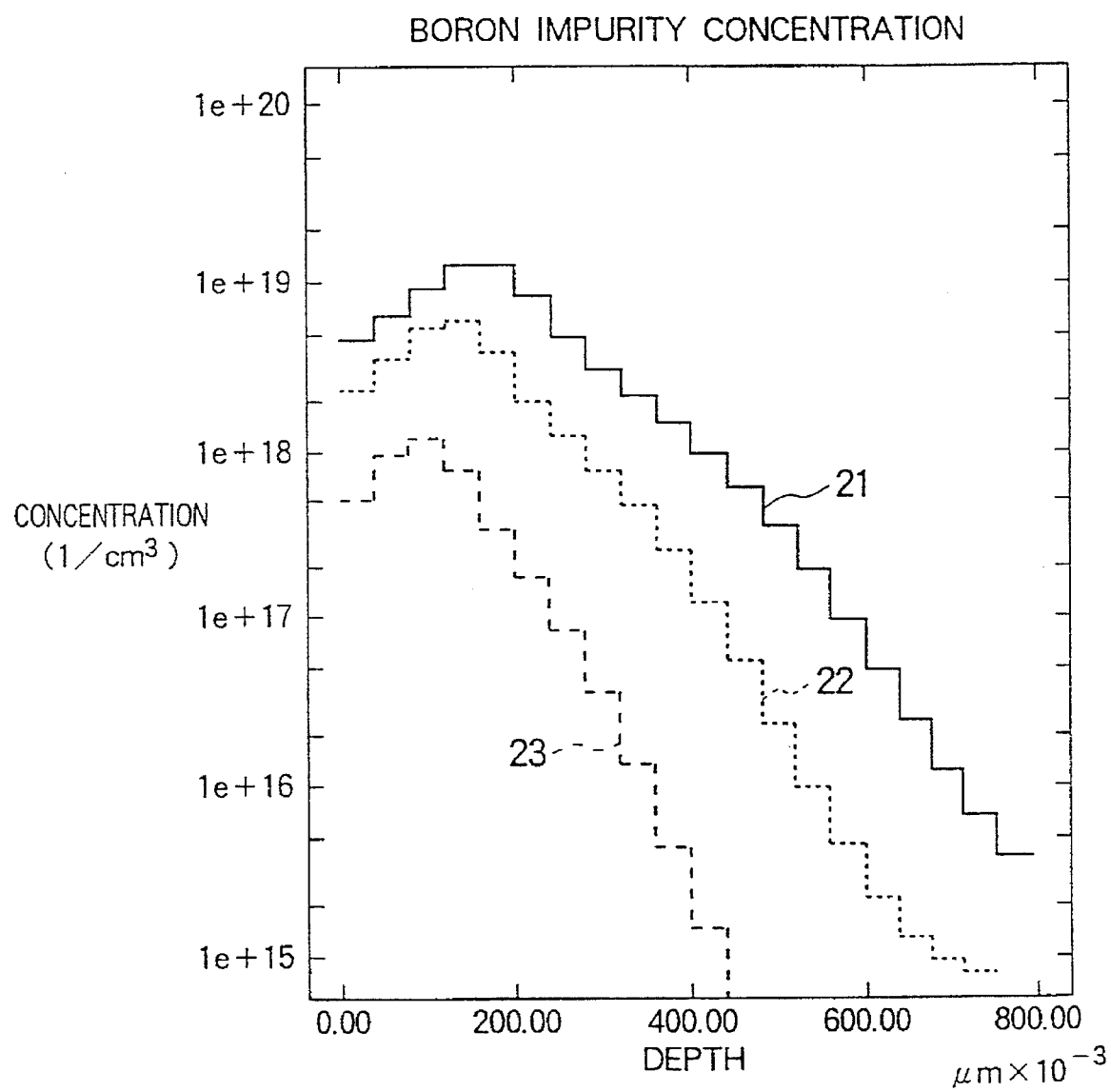
FIG. 6 is a graphic illustration showing an example of the result from determination of an impurity concentration profile according to the process of FIG. 1 applied to the sample of FIG. 3.

FIG. 6 shows an example of the result of measurement thus obtained. Numeral 21 represents an impurity distribution diagram obtained at a central portion of the diffused layer, numeral 22 represents an impurity distribution at a position located 0.2 µm inside the $SiO_2$ film from the edge of the initial third portion 12c of the opening 12, and numeral 23 represents an impurity concentration at a position located 0.5 µm inside the $SiO_2$ film from the edge of the initial third portion 12c. The abscissa represents the depth of the level for the measurement. As compared with a resolution on the order of µm which can be obtained by a conventional chemical etching process, it is apparent that a measurement of far greater fineness can be made in both the lateral direction and depth direction, as illustrated in FIG. 6.

EMBODIMENT 2

Figure 7:
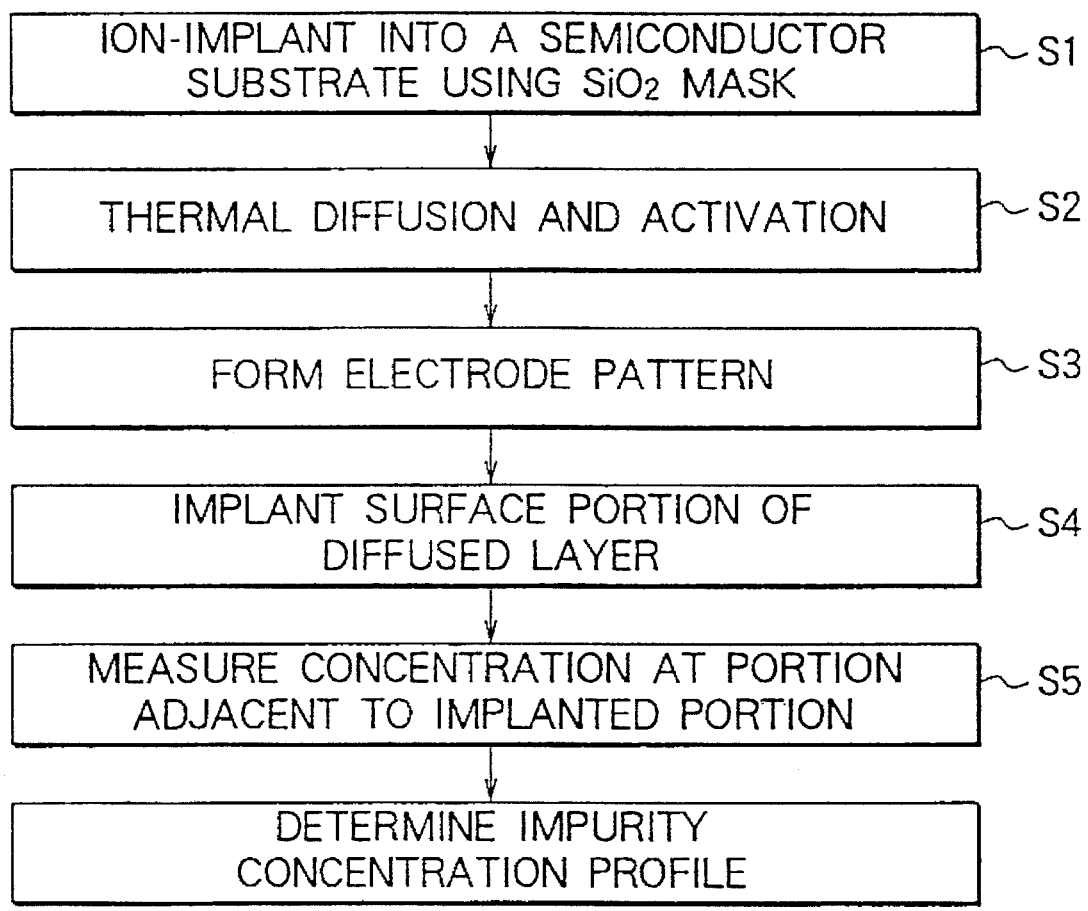
FIG. 7 is a flowchart of a method for determining impurity concentration profile according to a second embodiment of the present invention.

A second embodiment of the present invention will be described with reference to FIG. 7. The present embodiment is different from the first embodiment only at the fourth step S4. Accordingly, the remaining steps will not detailed here for avoiding a duplication. The fourth step S4 in the present embodiment includes implanting of inactivating ions through the opening in the mask pattern to thereby increase the resistivity of the specific portion of the diffused layer, instead of the etching of the diffused layer in the first embodiment.

The fourth step S4 functions for increasing the local resistivity of the implanted portion of the diffused layer to a sufficient level, i.e., substantially non-conductive level. The implanting step employs a focused ion beam (FIB) apparatus to implant Ga ions, for example, into the desired portion of the diffused layer. The use of FIB apparatus enables an accurate local implantation of the inactivating impurity ions to a high concentration, thereby raising the resistivity of the diffused layer portion to a sufficient high level.

A variable implantation energy of the apparatus greatly facilitates the generation of the successive high resistivity portions in the diffused layer during the repetition of the fourth and the fifth steps. Since such FIB apparatus provides a localized beam, a lateral gradation can be also obtained in the diffused layer by using such apparatus alone as well as vertical direction. However, by taking a beam spreading effect into consideration, a trial experiment of the fourth step was conducted, in accordance with the present embodiment, which included a step of shadowing a mask edge in first step S1, and successfully demonstrated an improved accuracy in the lateral direction on the order of sub-micron.

It should be understood that the method of the present invention is effective in a typical ion implantation having a uniform spread in addition to the focused ion beam.

While the present invention has been described in connection with the determination of a profile of impurity distribution caused by diffusion from the ion implantation, it is considered that the present invention is also applicable to the determination of an ion distribution in which the diffusion occurs by means other than the ion implantation: for example, contamination of the substrate.

Also it should be understood that the present invention is not limited to a silicon semiconductor substrate, but is equally applicable to a substrate including an insulator such as SOI, or a compound semiconductor substrate.

The present invention is not limited to embodiments as described above and it will be obvious for those skilled in the art that various modifications or alterations can be easily made based on the above embodiments within the scope of the present invention.

What is claimed is:

1. A method for determining an impurity concentration profile for a diffused region of a semiconductor including the steps of forming a plurality of electrodes on a surface of the diffused region, etching the surface of the diffused region, measuring at least one of sheet resistance and hall resistance of the etched surface of the diffused region by using the electrodes, and converting the measured values of the one of sheet resistance and hall resistance into corresponding impurity concentrations.

2. A method for determining an impurity concentration profile as defined in claim 1 wherein at least said etching and measuring are repeated plurality of times in cyclic order for different portions of the diffused region.

3. A method for determining an impurity concentration profile as defined in claim 2 wherein the etchings as repeated include a plurality of successive etchings of first portions of the diffusion region aligned in a depth direction and a plurality of subsequent successive etchings of second portions of the diffusion region aligned in the depth direction, the second portions being adjacent to the first portions in the direction parallel to the surface of the diffused region.

4. A method for determining an impurity concentration profile as defined in claim 3 further including the step of forming a mask pattern before forming the electrodes, the mask pattern having openings for the electrodes and for the first portions.

5. A method for determining an impurity concentration profile as defined in claim 4 wherein one of the second portions is exposed from the mask pattern by ion-milling of the mask pattern.

6. A method for determining an impurity concentration profile as defined in claim 1 further including the step of implanting and diffusing impurity ions to form the diffused layer.

7. A method for determining an impurity concentration profile as defined in claim 6 wherein the mask pattern has a thickness larger than an energy range of the impurity ions during the implanting.

8. A method for determining an impurity concentration profile for a diffused region of a semiconductor including the steps of forming a plurality of electrodes on the surface of the diffused region, implanting inactivating ions into a portion of the diffused region, measuring at least one of sheet resistance and hall resistance of the etched surface of the diffused region by using the electrodes, and converting the measured values of the one of sheet resistance and hall resistance into corresponding impurity concentrations.

9. A method for determining an impurity concentration profile as defined in claim 8 wherein at least said implanting and measuring are repeated plurality of times in cyclic order.

10. A method for determining an impurity concentration profile as defined in claim 9 wherein the implantings as repeated include a plurality of successive implantings of first portions of the diffusion region aligned in a depth direction and a plurality of subsequent successive implantings of second portions of the diffusion region aligned in the depth direction, the second portions being adjacent to the first portions in the direction parallel to the surface of the diffused region.

11. A method for determining an impurity concentration profile as defined in claim 10 further including the step of forming a mask pattern made of an insulating film before forming the electrodes, the mask pattern having openings for the electrodes and for the first portions.

12. A method for determining an impurity concentration profile as defined in claim 11 wherein one of the second portions is exposed from the mask pattern by ion-milling of the mask pattern.

13. A method for determining an impurity concentration profile as defined in claim 8 further including the step of implanting and diffusing impurity ions to form the diffused layer.

14. A method for determining an impurity concentration profile as defined in claim 13 wherein the mask pattern has a thickness larger than an energy range of the impurity ions during the implanting.

15. A method for determining an impurity concentration profile as defined in claim 8 wherein the inactivating ions include Ga ions.

* * * * *